United States Patent [19]

Kikuchi et al.

[11] Patent Number: 4,983,861
[45] Date of Patent: Jan. 8, 1991

[54] SEMICONDUCTOR INTEGRATED CIRCUIT WITH AN INPUT BUFFER CIRCUIT FOR PREVENTING FALSE OPERATION CAUSED BY POWER NOISE

[75] Inventors: Shinichi Kikuchi; Hiroshi Iwahashi, both of Yokohama; Hideo Kato, Kawasaki; Isao Sato, Kawasaki, all of Japan

[73] Assignee: Kabushiki Kaisha Toshiba, Kawasaki, Japan

[21] Appl. No.: 412,120

[22] Filed: Sep. 25, 1989

[30] Foreign Application Priority Data

Sep. 26, 1988 [JP] Japan .................. 63-240023

[51] Int. Cl.$^5$ ................ H03K 19/003; H03K 19/094; H03K 17/16; H03K 17/284
[52] U.S. Cl. .................... 307/443; 307/449; 307/468; 307/594; 307/451; 365/206; 365/226
[58] Field of Search ............ 307/443, 448, 449, 468, 307/481, 542, 270, 571, 572, 574, 576, 575, 577, 584, 585, 594, 451; 365/189.06, 189.08, 206, 226, 230.01

[56] References Cited

U.S. PATENT DOCUMENTS

| | | | |
|---|---|---|---|
| 3,769,523 | 10/1973 | Suzuki | 307/451 |
| 3,911,289 | 10/1975 | Takemoto | 307/451 |
| 4,420,823 | 12/1983 | Shimada | 365/206 |
| 4,626,715 | 12/1986 | Ishii | 307/585 |
| 4,638,184 | 1/1987 | Kimura | 307/296.8 |
| 4,785,203 | 11/1988 | Nakamura | 307/448 |

FOREIGN PATENT DOCUMENTS 61-104397 5/1986 Japan .

Primary Examiner—Stanley D. Miller
Assistant Examiner—David R. Bertelson
Attorney, Agent, or Firm—Finnegan, Henderson, Farabow, Garrett and Dunner

[57] ABSTRACT

A semiconductor integrated circuit comprises a first input circuit for generating an internal chip enable signal in response to a chip enable signal externally applied; and a second input circuit for supplying to an internal circuit a signal corresponding to a data signal externally applied thereto, the second input circuit containing a gate circuit controlled by an internal chip enable signal. The gate circuit responds to the data signal at a first response speed, and responds to the internal chip enable signal at a second response speed when the semiconductor integrated circuit is changed from the active state to the stand-by state. The second response speed being slower than the first response speed, so as to prevent the semi-conductor integrated circuit from being set into the stand-by state by a false operation of the first input circuit.

26 Claims, 12 Drawing Sheets

SEMICONDUCTOR INTEGRATED CIRCUIT WITH AN INPUT BUFFER CIRCUIT FOR PREVENTING FALSE OPERATION CAUSED BY POWER NOISE

BACKGROUND OF THE INVENTION

1. Field of the Invention

The present invention relates to a semiconductor integrated circuit, and in particular, to an input buffer circuit which cannot cause false operation by power noise.

2. Description of the Related Art

FIG. 1 shows a configuration of an ordinary semiconductor memory device. As shown, the memory device is made up of a row address buffer circuit 41, row decoder 42, memory cell array 43, column address buffer circuit 44, column decoder 45, sense amplifier 46, output buffer circuit 47, and chip enable buffer circuit 48.

The chip enable buffer circuit 48 receives an external chip enable signal $\overline{CE}$. When the signal $\overline{CE}$ is a logic "0", the memory chip is in an active mode. When the signal $\overline{CE}$ is a logic "1", the memory chip is in a stand-by mode. The enable buffer 48 supplies an internal chip enable signal $\overline{CEi}$ to the row address buffer 41, row decoder 42, column address buffer 44, and column decoder 45. These circuits 41, 42, 44 and 45 are controlled by the internal chip enable signal $\overline{CEi}$. In the stand-by mode, the power dissipation of those circuits is reduced. In other words, the power dissipation of the memory chip is controlled by the external chip enable signal $\overline{CE}$. The output buffer circuit 47 rapidly charges or discharges an external large load capacitor by means of a transistor having a large current drive capability. A typical circuit arrangement of the output buffer 47 is shown in FIG. 2.

In FIG. 2, a signal denoted as OE1 is an output enable signal outputted from a control pulse signal generator (not shown) provided in the memory device of FIG. 1. A signal denoted $\overline{OE1}$ is the inverted signal of the signal OE1. When the signal OE1 and $\overline{OE1}$ are a logic "1" and a logic "0" respectively, the data Di derived from the memory cell array 43 of FIG. 1 is applied as potential Va to the gate of a p-channel MOS transistor 56 through a NOR gate 52 and an inverter 54. Also, the data Di is applied as potential Vb to the gate of an n-channel MOS transistor 57 through a NAND gate 53 and an inverter 55, the transistor 56 or 57 being selectively turned on thereby, in accordance with the data Di from the cell array 43.

When the transistor 56 is turned on, an output terminal 58 is charged toward a potential of a power source terminal Vcc. As a result, output data Dout of a logic "1" is outputted at the output terminal 58. When the transistor 57 is turned on, the output terminal 58 is discharged toward a ground potential. As a result, output data Dout of a logic "0" is outputted. To rapidly charge and discharge the output terminal 58 connected an external large load capacitor 60, the current drive capability of each of the transistors 56 and 57 is large.

The output buffer 47 is connected to an external power source 70 through line L1 and line L2 The circuits shown in FIG. 1 are all coupled with the line L1 and the line L2. Those lines L1 and L2 contain parasitic inductances 71 and 72, respectively. Because of the presence of those inductances, the power-source potential Vcc or the ground potential Vss in the memory chip is varied, when current Is or It flows through the transistor 56 or 57 respectively for charging or discharging of the output terminal 58.

Assuming that the value of each inductance L1 and L2 is L, and the rate of change of current "i" flowing through those inductances with respect to time "t" is di/dt, a potential variation ΔV of each of the power-source potential Vcc and the ground potential Vss in the memory chip can be expressed by $$\Delta V = L \cdot (di/dt).$$

Such a potential variation is called a power noise.

A timing chart shown in FIG. 3 describes the relation of operation-states of the output buffer 47 to power noise. As seen from the figure, when the transistor 56 is turned on and the current Is flows, the power-source potential Vcc in the memory chip temporarily swings in the negative direction, and then swings in the positive direction. When the transistor 57 is turned on and the current It flows, the ground potential Vss in the memory chip temporarily swings in the positive direction, and then swings in the negative direction.

Such variations of power source voltage may cause false operation of each of the circuits of the memory device shown in FIG. 1. The probability of the occurrence of the false operator is particularly high in the input circuits receiving external signals, such as the row address buffer 41, column address buffer 44, and chip enable buffer 48.

Such false operation caused by power noise will be described with reference to the row address buffer 41 and the chip enable buffer 48. A typical circuit arrangement including the row address buffer 41 and the chip enable buffer 48 is illustrated in FIG. 4. The row address buffer 41 receives an external address signal which is generated by another integrated circuit. Accordingly, even if the power source potential in the memory chip varies, the potential of the address signal does not vary. It assumes that an address signal of a logic "0" is applied to the row address buffer 41. If the ground potential Vss varies in the negative direction, the row address buffer 41 which decides the logic level of the input signal with respect to the ground potential Vss may mistakenly recognize this logic "0" signal as a logic "1" signal, because a difference between the potential of the input signal and the ground potential Vss grows.

In a conventional technique, a C-R delay circuit TC is provided at the prestage of the row address buffer 41, in order to prevent the memory device from false operation. With the use of the circuit TC, the input terminal of the row address buffer 41 is coupled with the ground potential Vss through the capacitor C. Accordingly, when the ground potential Vss varies, the potential at the input terminal of the buffer 41 also varies. This fact indicates that even if the power voltage varies, the difference between the input terminal potential and the ground potential is not changed. Therefore, the row address buffer 41 will not mistakenly recognize the logic level of the address signal.

The chip enable buffer 48, like the row address buffer 41, sometimes mistakenly recognizes the logic level of an external chip enable signal $\overline{CE}$ when the power source potential varies. In the chip enable buffer 48, it is not preferable to provide the C-R delay circuit TC at the prestage of the buffer 48. The reason for this is that such a provision of the circuit TC would have an adverse effect on the access speed performance of the memory device.

Generally, a semiconductor memory device has two modes of read operation. In the first read mode, data is read out of the memory chip in such a manner that when the memory chip is in an active state, the address signal is changed. In the second read mode, data is read out of the memory chip in such a manner that when the address signal remains unchanged, the operation state of the memory chip is changed from a stand-by state to an active state. The data read speed of the second mode is than the data read speed of the first mode. The reason for this is as follows. The row address buffer 41 is controlled by the internal chip enable signal $\overline{CEi}$ from the chip enable buffer 48. When the state of the memory chip changes from the stand-by state to the active state, the row address buffer 41 responds to the internal chip enable signal $\overline{CEi}$ which changes after a given retardation from the change of the external chip enable signal $\overline{CE}$. Accordingly, the row address buffer 41 starts to operate after the response time of the chip enable buffer 48. In other words, the data read speed when the chip enable signal $\overline{CE}$ changes is slower than that when the address signal is changed, by the response time of the chip enable buffer 48.

In the case where the C-R delay circuit TC is provided at the prestage of the row address buffer 41, the data read speed when the address signal changes is delayed by delay time of the C-R delay circuit TC. However, the read speed of the memory device does not suffer any damage, if the delayed data read speed when the address signal changes is not slower than that when the chip enable signal $\overline{CE}$ is changed. However, if the C-R delay circuit TC is provided at the prestage of the chip enable buffer 48, the data read speed when the chip enable signal $\overline{CE}$ changes, viz., the data read speed of the memory device is slowed by the delay time of the C-R delay circuit TC.

Accordingly, since the C-R delay circuit TC cannot be provided at the prestage of the chip enable buffer 48, the chip enable buffer 48 is susceptible to power noise. The logic level of the internal chip enable signal $\overline{CEi}$ may be inverted by the power noise, as previously mentioned, and all of the circuits that are controlled by the internal chip enable signal $\overline{CEi}$ will malfunction.

SUMMARY OF THE INVENTION

The present invention provides a semiconductor memory device which is insensitive to power noise and is operable at a high speed.

To achieve this, there is provided a semiconductor integrated circuit comprising: a first input circuit for generating an internal chip enable signal for controlling said semiconductor integrated circuit to be in an active state or a stand-by state, in response to a chip enable signal externally applied; and a second input circuit for applying a signal to an internal circuit, said signal is corresponding to a data signal externally applied, said second input circuit including a gate circuit responsive to said internal chip enable signal and said data signal, said gate circuit being arranged such that a first response speed of said gate circuit to said internal chip enable signal when the stand-by state is entered, is slower than a second response speed of said gate circuit to said data signal, to prevent said semiconductor integrated circuit from being mistakenly entered the stand-by state by false operation of said first input circuit.

With such an arrangement, the response speed of the gate circuit to the internal chip enable signal to be entered the stand-by state is slower than the response speed of the gate circuit to the data signal. Accordingly, even if the logic level of the internal chip enable signal is inverted by a power noise, the logic level at the output terminal of the gate circuit does not respond quickly to the inverted logic level of the internal chip enable signal. Therefore, when the period of time that the power noise is generated for is relatively short, the logic level of the internal chip enable signal that has been inverted is returned to the original logic level before the logic level at the output terminal of the gate circuit is inverted, thereby preventing the second input circuit from false operation. Accordingly, the circuit arrangement according to the present invention provides a semiconductor integrated circuit which is stable against the variation of power source potential.

DETAILED DESCRIPTION OF THE PREFERRED EMBODIMENTS

Figure 1:
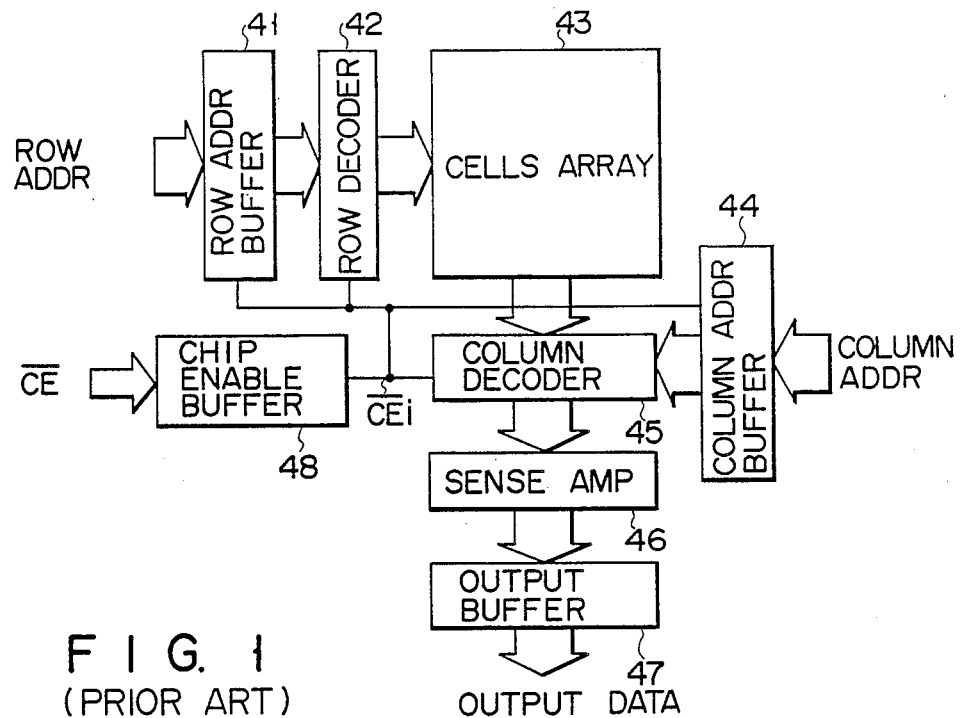
FIG. 1 is a block diagram showing a configuration of an ordinary semiconductor memory device.
Figure 2:
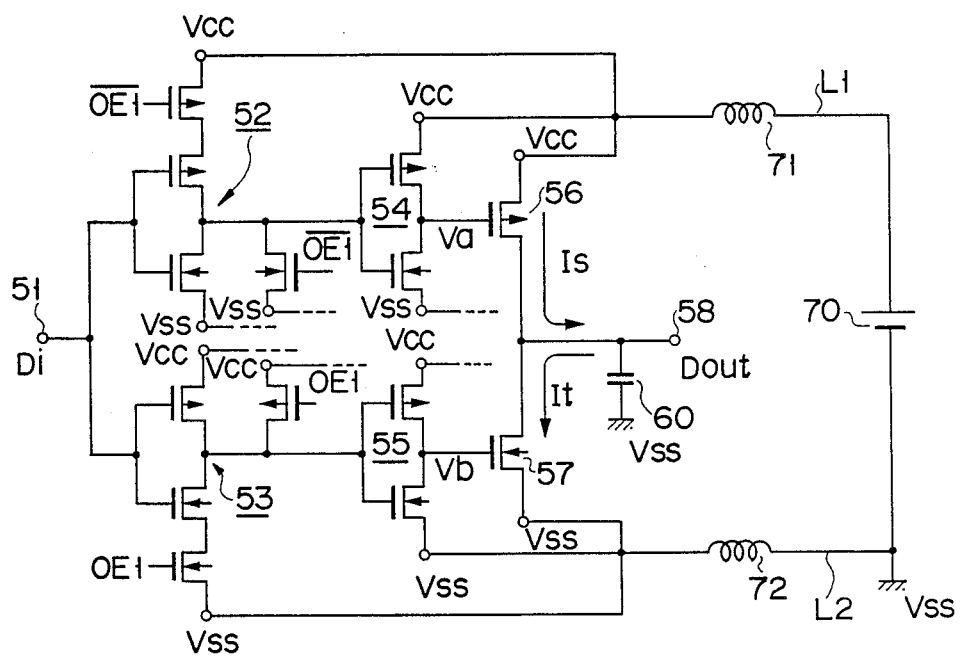
FIG. 2 is a circuit diagram of a typical output buffer circuit contained in the memory device of FIG. 1.
Figure 3:
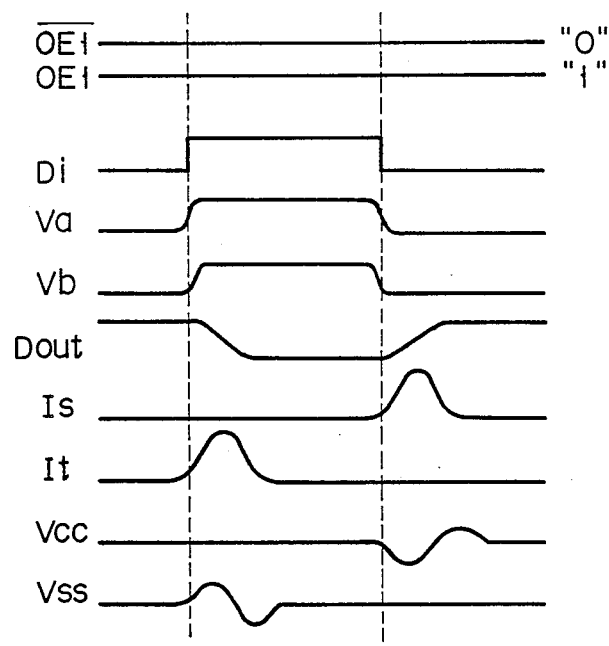
FIG. 3 is a timing chart showing an operation state of the output buffer circuit of FIG. 2 and the generation of a power noise.
Figure 4:
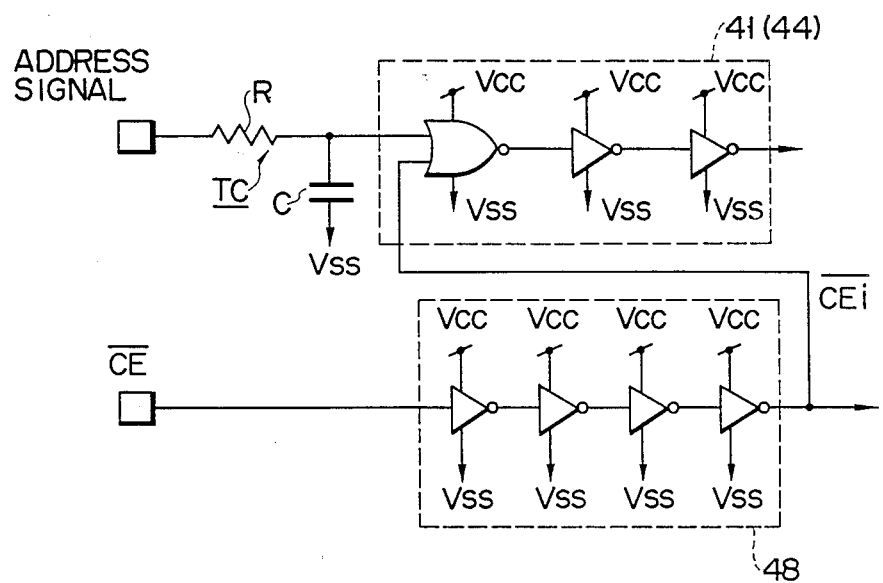
FIG. 4 shows a circuit arrangement containing a row address buffer circuit and a chip enable buffer circuit which are contained in the semiconductor memory device of FIG. 1.
Figure 5:
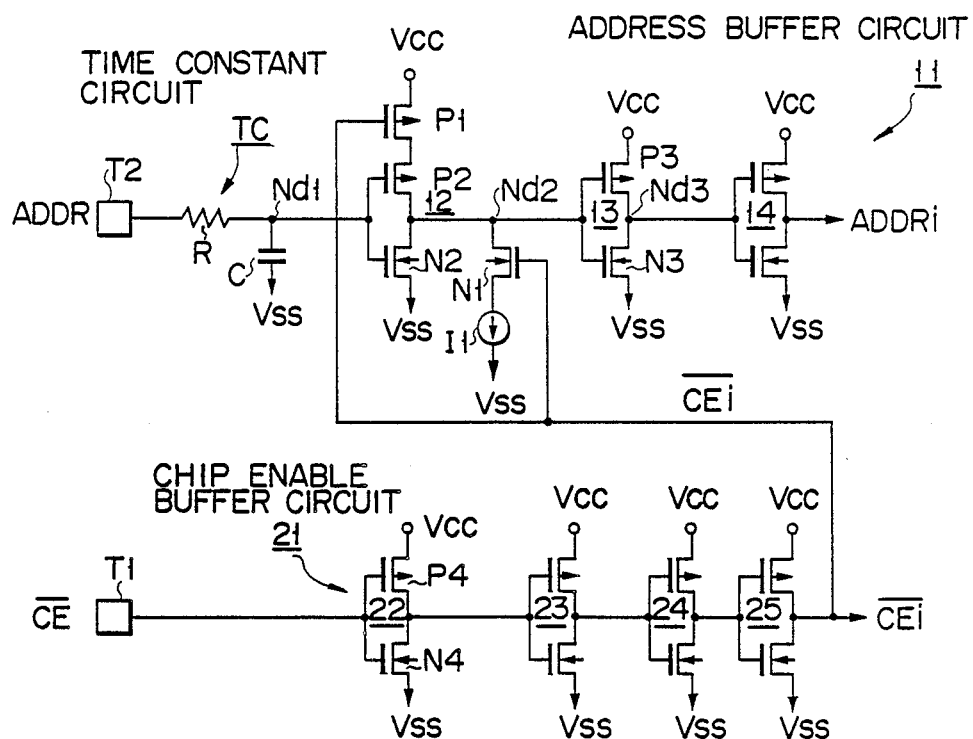
FIG. 5 shows a circuit arrangement containing input circuits provided in a semiconductor integrated circuit according to a first embodiment of the present invention.

FIG. 5 shows a circuit arrangement containing input circuits provided in a semiconductor integrated circuit according to a first embodiment of the present invention. A chip enable buffer circuit 21 and an address buffer circuit 11, together with an internal circuit (not shown), are formed on a semiconductor chip. Those circuits are connected to a power-source potential Vcc terminal and a ground potential Vss terminal. The chip enable buffer circuit 11 and the address buffer circuit 21 serve as input circuits to the integrated circuit.

The chip enable buffer 21 receives an external chip enable signal $\overline{CE}$ at the input terminal T1, and supplies it as an internal chip enable signal $\overline{CEi}$. The chip enable buffer 21 comprises four CMOS inverters 22 to 25 connected in a cascade fashion. These inverters 22 to 25 each contain a p-channel enhancement mode MOS transistor and an n-channel enhancement mode MOS transistor. The source-drain paths of the transistors are connected in series between the power-source potential Vcc terminal and ground potential Vss terminal.

An address buffer circuit 11 receives an external address signal ADDR at the input terminal T2, and supplies an internal address signal ADDRi, corresponding to the received address signal ADDR, to the internal circuit (not shown). The address buffer 11 is controlled by an internal chip enable signal $\overline{CEi}$, output from the chip enable buffer 21.

The address buffer 11 comprises a 2-input NOR gate 12, and CMOS inverters 13 and 14. The NOR gate 12 receives at the first input terminal an internal chip enable signal $\overline{CEi}$ from the chip enable buffer 21, and at the second input terminal the address signal ADDR. The NOR gate 12 includes p-channel enhancement mode MOS transistors P1 and P2, n-channel enhancement mode MOS transistors N1 and N2, and a current source I1. The source of the transistor P1 is connected to the power-source potential Vcc terminal, its drain is connected to the source of the transistor P2, and the drain of the transistor P2 is connected to an output node Nd2 of the NOR gate 12. The drain of the transistor N2 is also connected to the node Nd2, and its source is connected to the ground potential Vss terminal. The drain of transistor N1 is connected to the node Nd2, and its source is connected to the ground potential Vss terminal through the current source I1.

The internal chip enable signal $\overline{CEi}$ is applied to the gates of the transistors P1 and N1. The external address signal ADDR is applied to the gates of the transistors P2 and N2 through the input terminal T2. The current value of the current source I1 is smaller than the value of the current flowing from the node Nd2 to the ground potential Vss terminal through the drainsource path of transistor N2.

The CMOS inverters 13 and 14 in the address buffer circuit 11 each contain a p-channel enhancement mode MOS transistor and an n-channel enhancement mode MOS transistor. The source-drain paths of the transistors are connected in series between the Vcc and Vss terminals.

A C-R delay circuit TC is connected between the input terminal T2 and an input node Nd1 of the address buffer circuit 11. The C-R delay circuit TC comprises a resistor R and a capacitor C. The resistor R is connected between the input terminal T2 and the node Nd1. One end of the capacitor C is connected to the node Nd1, and the other end of the capacitor C is connected to the ground potential Vss terminal.

Figure 6:
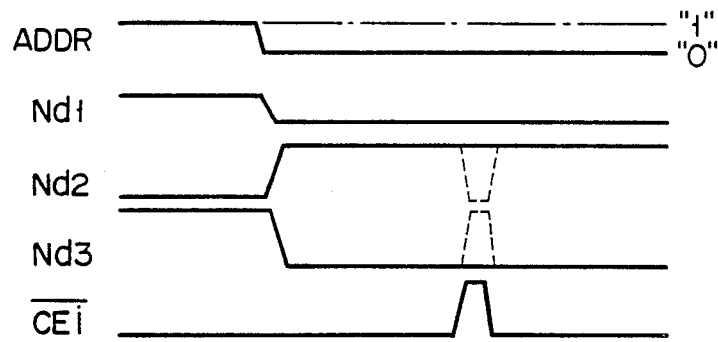
FIGS. 6 and 7 show graphs useful in explaining the dynamic characteristic of the integrated circuit shown in FIG. 1.

The operation of the address buffer 11 and the chip enable buffer 21 will be described with reference to FIGS. 6 and 7. When the external chip enable signal $\overline{CE}$ of a logic "0" is applied to the input terminal T1, the chip enable buffer 21 produces the internal chip enable signal $\overline{CEi}$ of a logic "0". The internal chip enable signal $\overline{CEi}$ is applied to the first input of the 2-input NOR gate 12 of the address buffer 11, viz., the gates of the transistors P1 and N1. Then, the transistor P1 is turned on, and the transistor N1 is turned off. Under this condition, the NOR gate 12 is in an active state, and responds to the address signal ADDR.

Let us consider a situation where when the memory chip is in an active state the address signal ADDR is changed from a logic "1" to a logic "0". In this situation, a logic level at the input node Nd1 of the address buffer 11 is changed from a logic "1" to a logic "0" after a pregiven delay by the C-R delay circuit TC. Consequently, a logic level at the output node Nd2 of the 2-input NOR gate 12 changes from a logic "0" to a logic "1". And a logic level at the output of the CMOS inverter 13 changes from "1" to "0". Accordingly, a logic level of the output of the succeeding CMOS inverter 14 changes from "0" to "1".

The output signal of the CMOS inverter 14 is supplied as an internal address signal ADDRi to the internal circuit. In the internal circuit (which includes an address decoder, memory cell array, sense amplifier, output buffer, etc ), data is read from a memory cell which is addressed by the internal address signal ADDRi In this situation, when the output buffer produces the read data, the ground potential Vss varies in the negative direction. In the address buffer 11, however, the C-R delay circuit TC preceding the buffer 11 absorbs the variation of the power source potential. That is, when the ground potential Vss varies in the negative direction, the capacitor C of the circuit TC that exists between the node Nd1 and the Vss terminal causes the potential at the node Nd1 of the buffer 11 to change also in the negative direction. As a result, the potential difference between the Vss terminal and the input node Nd1 is kept at a constant value. Therefore, even if the ground potential Vss varies in the negative direction, the address buffer 11 will never mistakenly recognize the logic "0" of the address signal ADDR as the logic "1".

The chip enable buffer 21 does not contain the C-R delay circuit TC at its preceding stage, therefore, when the ground potential Vss varies in the negative direction, a potential difference between the input node of the CMOS inverter 22 and the ground Vss terminal becomes large, so that the buffer 21 may mistakenly recognize the logic "0" of the chip enable signal $\overline{CE}$ as the logic "1". In this case, with the potential variation at the output node of the CMOS inverter 22, the potential at the output node of the CMOS inverter 25 also varies. In an extreme case, the logic level of the internal chip enable signal $\overline{CEi}$ is inverted from "0" to "1".

If the logic level of the internal chip enable signal $\overline{CEi}$ is inverted from "0" to "1", the transistor N1 of the NOR gate 12 in the address buffer 11 is turned on. In this case, if the current source I1 is not used, and the source of the transistor N1 is directly connected to the Vss terminal, the potential at the output node Nd2 of the NOR gate 12 is rapidly pulled down as indicated by a dotted line in FIG. 6, and therefore the logic level of the output node Nd2 is inverted from "1" to "0". Also, the logic level of the output node Nd3 of the CMOS inverter 13 is inverted from "0" to "1". The result is that the internal address signal ADDRi of an incorrect logic level is produced from the address buffer 11.

It is noted here that in the instant embodiment, the current flowing from the node Nd2 to the ground potential Vss terminal through the transistor N1 is limited to a small value by the current source I1. Accordingly, even if the internal chip enable signal $\overline{CEi}$ is inverted from a logic "0" to a logic "1" and the transistor N1 is turned on, the logic level of the output node Nd2 will not be inverted to a logic "0". Therefore, if the logic level of the internal chip enable signal $\overline{CEi}$ is returned to the correct logic level and the transistor N1 is turned off before the logic level at the output node Nd2 of the NOR gate 12 is inverted, the address buffer 11 will never produce an internal address signal ADDRi of an incorrect logic level.

The time required for the logic level at the output node Nd2 to be changed from a logic "1" to a logic "0" is determined by the current value of the current source I1 and the parasitic capacitance existing in the node Nd2 (the parasitic capacitance including the wiring capacitance between the NOR gate 12 and the CMOS inverter 13, and the gate capacitance of transistors P3 and N3 of the CMOS inverter 13). In other words, a false operation of the address buffer 11 due to the variation of the power source potential can be prevented by selecting the current value of the current source I1 and the parasitic capacitance of the node Nd2 so that a time required for the logic level at the node Nd2 to be changed from a logic "1" to a logic "0" is longer than the duration of the logic "1" of the internal chip enable signal $\overline{CEi}$ caused by the variation of the power source potential.

Figure 7:
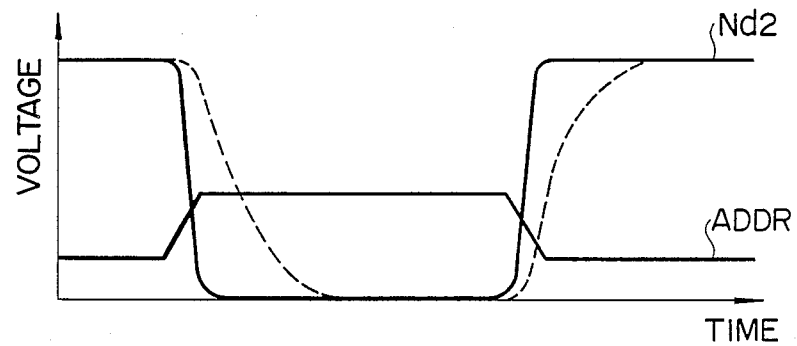

In this case, if the parasitic capacitance of the node Nd2 is set to be large, a potential variation at the output node Nd2 for the address signal ADDR is delayed by its parasitic capacitance, as indicated by a dotted line in FIG. 7. The delay of the potential variation at the node Nd2 would delay the data read speed. For this reason, it is unpreferable to set the parasitic capacitance of the node Nd2 to large.

In the case where the current value of the current source I1 is set to be small as in the first embodiment, the time required for the operating state of the NOR gate 12 to be changed from an active state to a stand-by state is longer, but the potential variation of the output node Nd2 is not delayed when the address signal ADDR changes. Therefore, in the case where the current value of the current source I1 is set to be small, even if the logic level of the internal chip enable signal $\overline{CEi}$ is inverted due to the variation of the power source potential the false operation of the address buffer 11 can be prevented. Further, as indicated by a solid line in FIG. 7, the potential at the output node Nd2 of the NOR gate 12 may be varied in accordance with a variation of the address signal ADDR at a relatively high speed.

In a conventional semiconductor integrated circuit, approximately 10 nS is the period of time in which a power source potential varies when the output buffer produces data. Approximately half of the above period, i.e., 5 nS, is the period of time during which the power voltage greatly varies, for example, the time in which the logic level of the internal chip enable signal $\overline{CEi}$ is inverted.

In such a case, the false operation of the address buffer 11 due to the variation the power source potential (power noise) can be prevented by setting the current value of the current source I1 so that the time taken for the logic level at the node Nd2 of the NOR gate 12 to change from a logic "1" to a logic "0" is longer than 5 nS.

Figure 8:
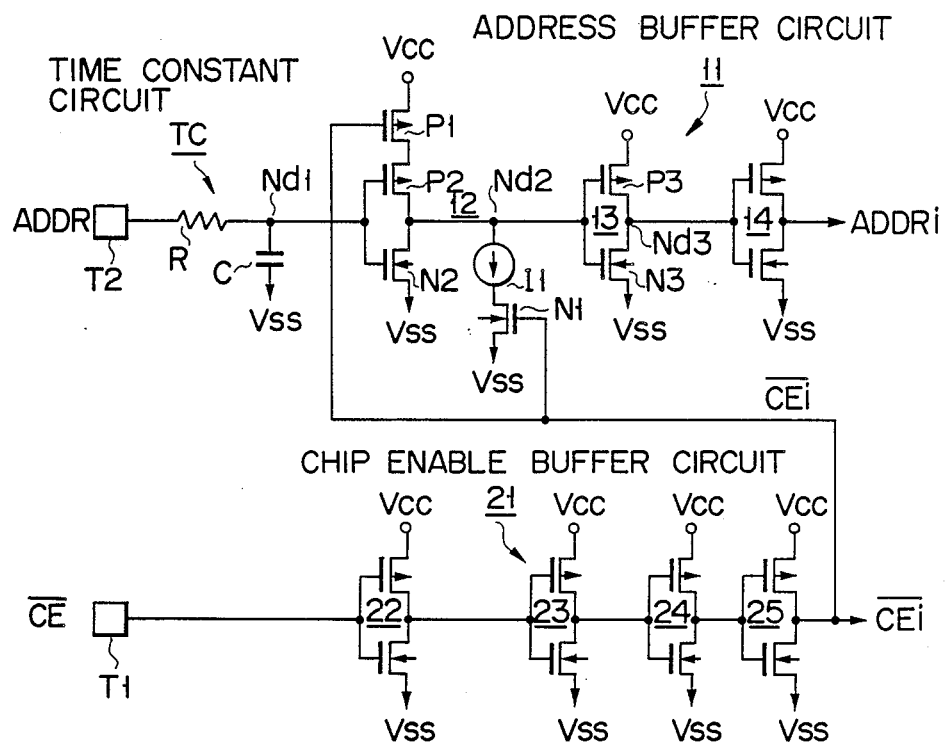
FIG. 8 shows a circuit arrangement containing input circuits provided in a semiconductor integrated circuit according to a second embodiment of the present invention.

Turning now to FIG. 8, there is shown the input circuits of a semiconductor integrated circuit according to a second embodiment of the present invention. The difference between the second embodiment and the first embodiment of FIG. 5 exists only in the arrangement of the NOR gate 12.

In the NOR gate 12 in the second embodiment, the current source I1 is connected between the output node Nd2 of the NOR gate 12 and the drain of the n-channel MOS transistor N1. The source of the transistor N1 is connected to the ground potential Vss terminal. With such an arrangement in the second embodiment, the current value flowing from the node Nd2 to the ground potential Vss terminal is determined by the current of the current source I1 when the transistor N1 is turned on. Accordingly, if the current value of the current source I1 is set to be small, the second embodiment can also prevent a false operation of the address buffer 11 due to the inversion of the internal chip enable signal $\overline{CEi}$.

Figure 9:
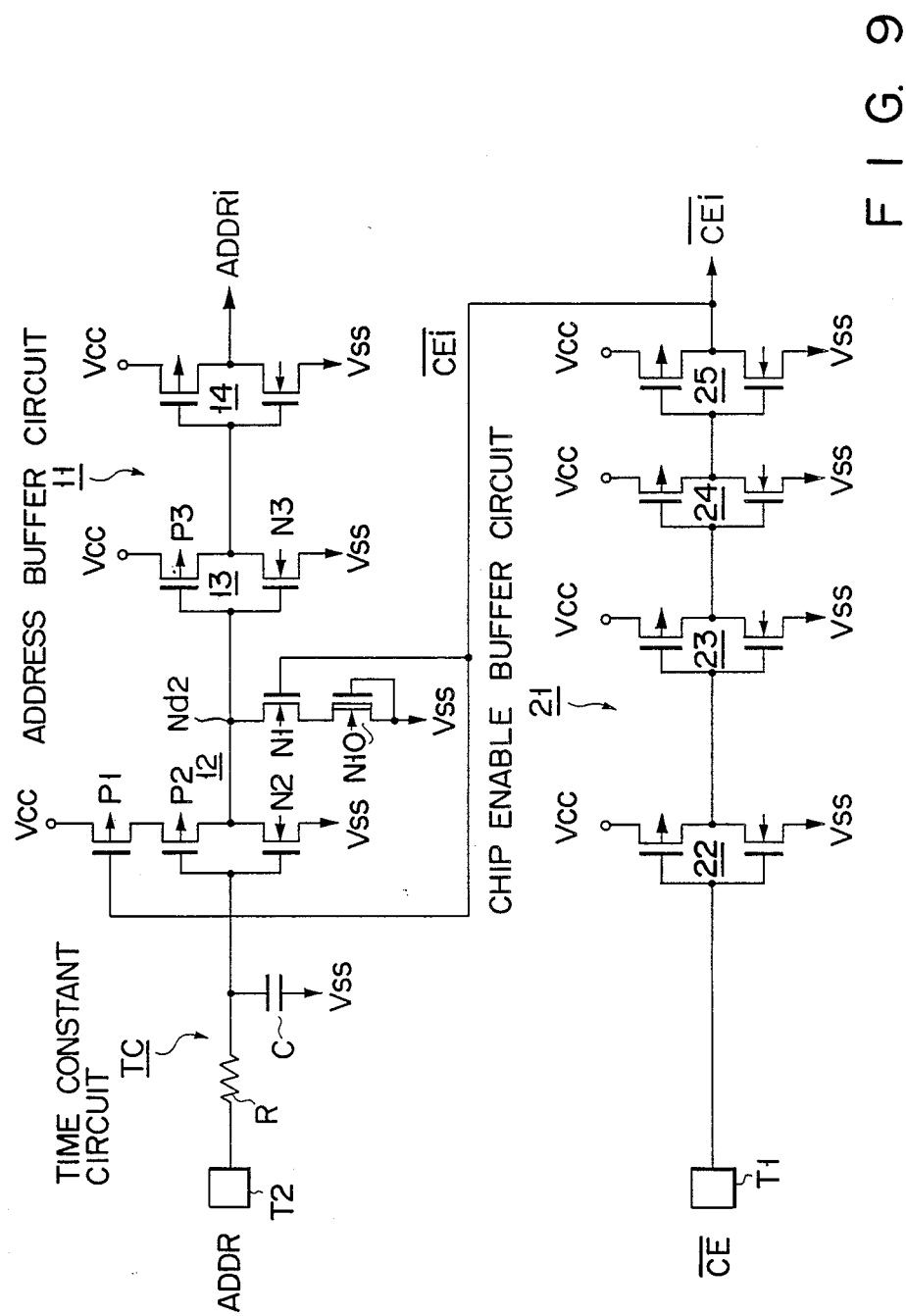
FIG. 9 shows a circuit arrangement containing input circuits provided in a semiconductor integrated circuit according to a third embodiment of the present invention.

FIG. 9 shows an arrangement of the input circuits of a semiconductor integrated circuit according to a third embodiment of the present invention. In this instance, an n-channel depletion mode MOS transistor N10 is used as the current source I1 provided in the NOR gate 12 in the first embodiment of FIG. 5. The gate and the source of the transistor N10 are connected to the ground potential Vss terminal The drain of the transistor N10 is connected to the source of the transistor N1.

The n-channel depletion mode MOS transistor N10, whose gate and source are connected, serves substantially as a constant current source. Therefore, if the current flowing through the transistor N10 is set to be small, the present embodiment can also prevent a false operation of the address buffer 11 due to the inversion of the internal chip enable signal $\overline{CEi}$.

The n-channel depletion mode MOS transistor N10 used in the present embodiment may be used in place of the current source I1 of the second embodiment shown in FIG. 8. In this case, the drain of the transistor N10 is connected to the output node Nd2 of the NOR gate 12 and the source and the gate are connected to the drain of the transistor N1.

Figure 10:
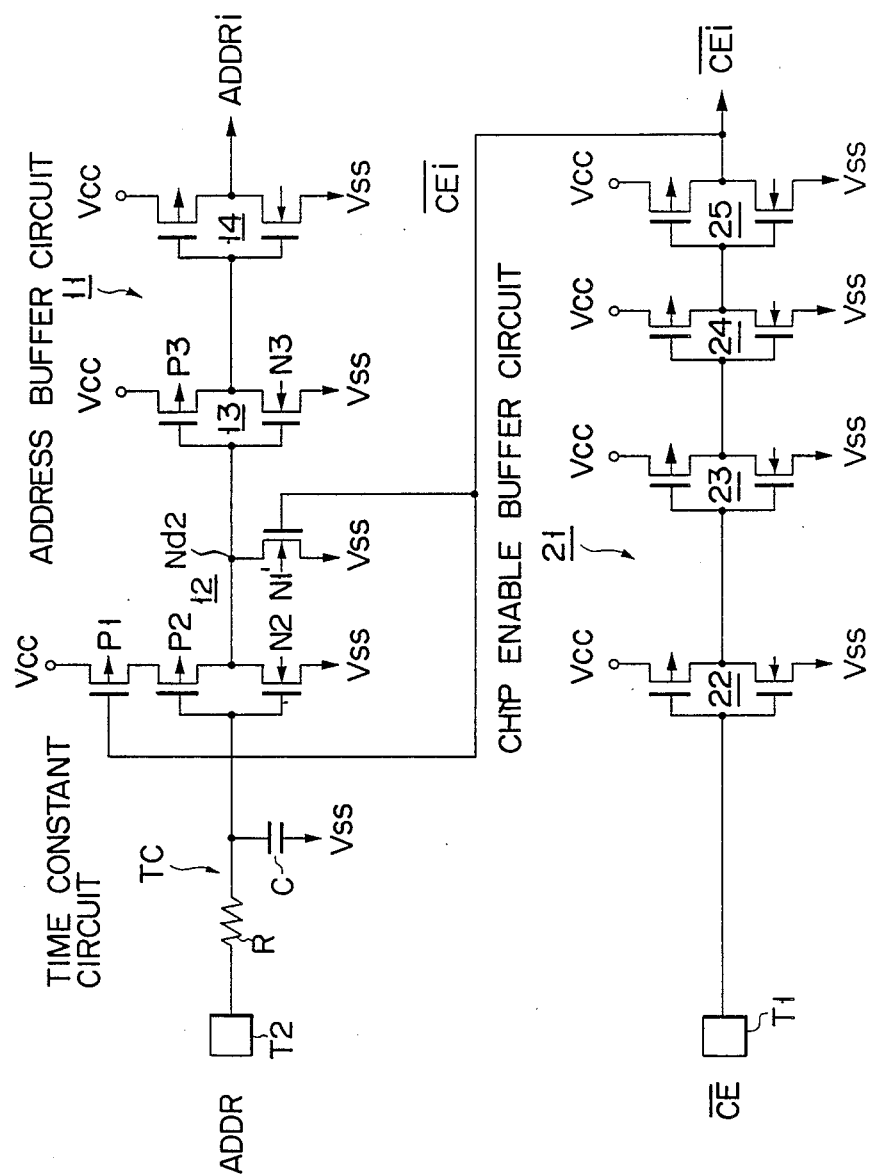
FIG. 10 shows a circuit arrangement containing input circuits provided in a semiconductor integrated circuit according to a fourth embodiment of the present invention.

FIG. 10 shows a circuit arrangement containing input circuits provided in a semiconductor integrated circuit according to a 4th embodiment of the present invention. In the 4th embodiment, the current source I1 is not used in the NOR gate 12, and an n-channel enhancement mode MOS transistor N1' is used in place of the n-channel enhancement mode MOS transistor N1 in the first embodiment of FIG. 5.

The drain of the transistor N1' is connected to the node Nd2, its source is connected to the ground potential Vss terminal, and the internal chip enable signal $\overline{CEi}$ derived from the chip enable buffer 21 is applied to the gate of the transistor N1'. The conductance of the transistor N1' is set to be smaller than that of the transistor N2 coupled in parallel with the transistor N1'. To be more specific, the conductance of the transistor N1' is selected so that the time taken for the logic level at the output node Nd2 to be changed from a logic "1" to a logic "0" is longer than the time that the internal chip enable signal $\overline{CEi}$ is inverted by the variation of the power source potential, viz., the time that the transistor N1' is turned on. To reduce the conductance of the transistor N1', the ratio (W/L) of the channel width W to the channel length L of the transistor N1' is set to be smaller than that of the transistor N2.

Also in the 4th embodiment, featured by the small conductance of the transistor N1' controlled by the internal chip enable signal $\overline{CEi}$, the current flowing from the node Nd2 to the ground potential Vss terminal may be set to be small. Therefore, it is evident that the 4th embodiment may also attain advantages comparable with those of the first embodiment.

Figure 11:
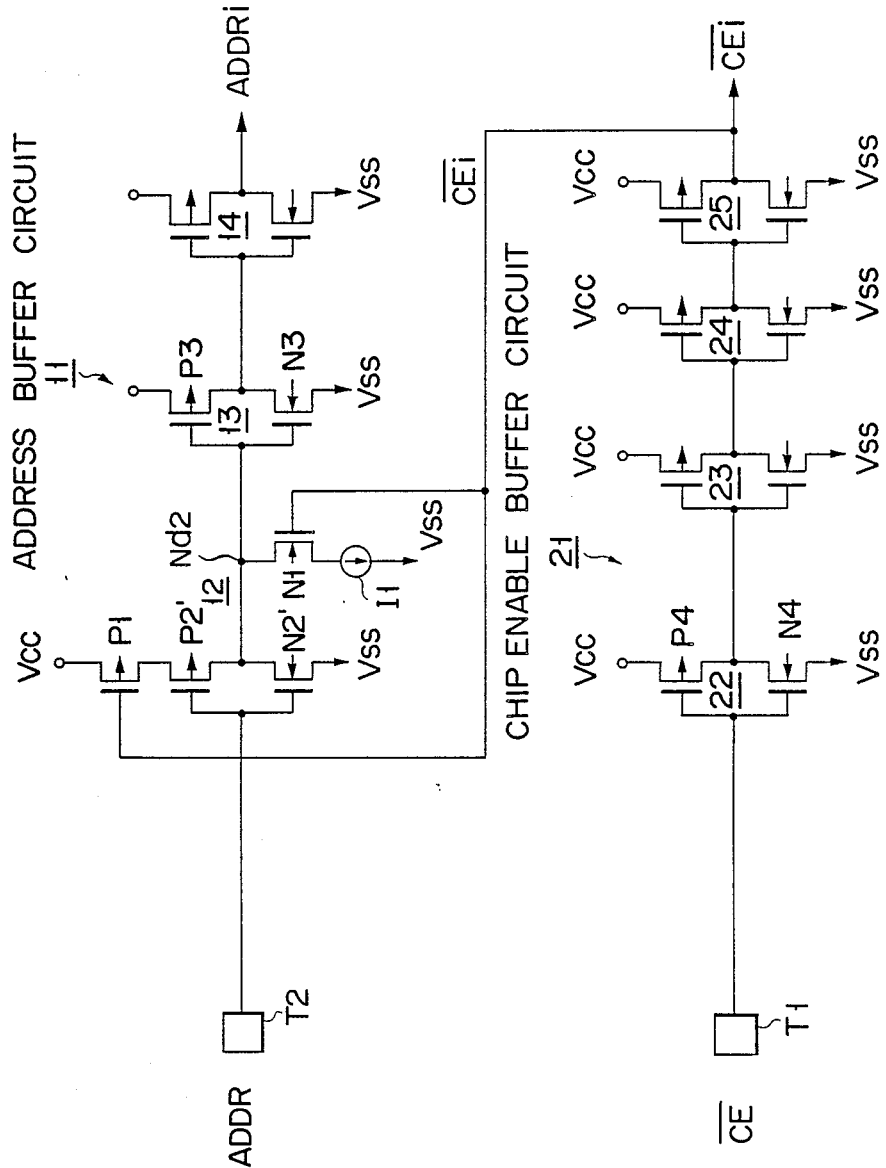
FIG. 11 shows a circuit arrangement containing input circuits provided in a semiconductor integrated circuit according to a 5th embodiment of the present invention.

FIG. 11 shows a circuit arrangement containing input circuits provided in a semiconductor integrated circuit according to a 5th embodiment of the present invention. The 5th embodiment is different from the first embodiment of FIG. 5 in the following points. The C-R delay circuit TC, which is located at the prestage of the address buffer circuit 11 in the first embodiment, is not used in this embodiment. Further, the transistors P2 and N2 in the NOR gate 12 are replaced by p- and n-channel enhancement mode MOS transistors P2' and N2' whose conductance are smaller than those of the transistors P2 and N2.

In the 5th embodiment without the C-R delay circuit TC, when the ground potential Vss varies in the negative direction under a condition where an address signal ADDR of a logic "0" is applied to the input terminal T2, the potential difference between the input terminal T2 and the ground Vss terminal becomes large whereby the transistor N2' in the NOR gate 12 may be turned on. In this case, if the conductance of the transistor N2' is set to be larger as in the case of the ordinary memory device, the logic level of the output node Nd2 of the NOR gate 12 mistakenly changes from a logic "1" to a logic "0" immediately after the transistor N2' is turned on. It is noted that in the 5th embodiment where the conductance of the transistor N2' is set to be small, the logic level at the node Nd2 will not be inverted immediately after the transistor N2' is turned on due to the variation of the power source potential. Accordingly, the false operation of the address buffer 11 due to the variation of the power source potential can be prevented if the conductance of the transistor N2' is selected to be such a value that the time required for the logic level at the node Nd2 of the NOR gate 12 to be inverted from a logic "1" to a logic "0" by the transistor N2' is longer than the time that the transistor N2' is turned on due to the variation of the power source potential.

Similarly, when the power-source potential Vcc varies in the positive direction under a condition where an address signal ADDR of a logic "1" is applied to the input terminal T2, there is the possibility that the transistor P2' in the NOR gate 12 is mistakenly turned on, and the logic level at the output node Nd2 is mistakenly changes from a logic "0" to a logic "1". Also this false operation of the address buffer 11 can be prevented if the conductance of the transistor P2' is selected to be such a value that time required for the logic level at the node Nd2 of the NOR gate 12 to be inverted from a logic "0" to a logic "1" by the transistor P2' is longer than the time that the transistor P2' is turned on due to the variation of the power source potential.

In the case where the transistors P2' and N2' switched by an external address signal ADDR are designed to have small conductance, the operation speed of the address buffer 11 which is responsive to a change of the address signal ADDR is slow. As stated earlier, the data read speed of the memory device for changing the chip enable signal $\overline{CE}$ is slower than the data read speed for changing the address signal ADDR. Therefore, in the 5th embodiment, as in the first to 4th embodiments in which the address signal ADDR is delayed by the circuit TC, the slowdown of the operation speed of the transistor P2' and N2', does not have any adverse effect on the data read speed of the memory device.

Thus, the 5th embodiment requiring a lesser number of elements can have substantially the same advantages as the first to 4th embodiments.

Figure 12:
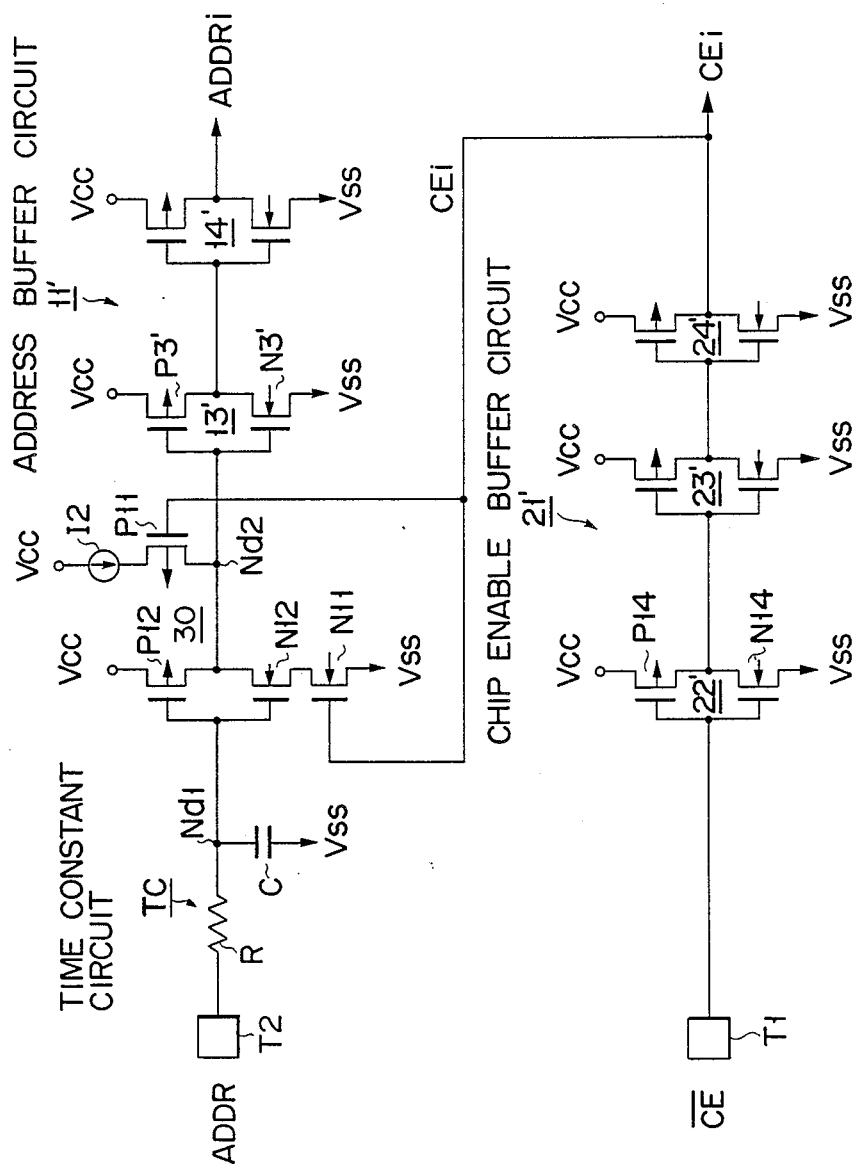
FIG. 12 shows a circuit arrangement containing input circuits provided in a semiconductor integrated circuit according to a 6th embodiment of the present invention.

FIG. 12 shows a circuit arrangement containing input circuits provided in a semiconductor integrated circuit according to a 6th embodiment of the present invention. The 6th embodiment is different from the first embodiment of FIG. 5 in the following points. A 2-input NAND gate 30 is used in place of the 2-input NOR gate 12. To control the NAND gate 30, a chip enable buffer circuit 21' is used in place of the chip enable buffer 21.

While the chip enable buffer 21 in the first embodiment includes four CMOS inverters connected in a cascade fashion, and the chip enable buffer 21' in the 6th embodiment includes three CMOS inverters 22', 23' and 24' connected in a cascade fashion. The chip enable buffer 21' produces an internal chip enable signal CEi of a logic "1" when it receives an external chip enable signal $\overline{CE}$ of a logic "0", and produces an internal chip enable signal $\overline{CEi}$ of a logic "0" when it receives an external chip enable signal $\overline{CE}$ of a logic "1".

In the address buffer 11', the 2-input NAND gate 30 receives, at the first input, an internal chip enable signal CEi from the chip enable buffer 21', and receives at the second input an external address signal ADDR. The NAND gate 30 includes p-channel enhancement mode MOS transistors P11 and P12, n-channel enhancement mode MOS transistors N11 and N12, and a current source I2. The drain of the transistor N12 is connected to the output node Nd2, and the source of the transistor N12 is connected to the drain of the transistor N11. The source of the transistor N11 is connected to the ground potential Vss terminal. The source of the transistor P12 is connected to the power-source potential Vcc terminal, and the drain of the transistor P12 is connected to the output node Nd2. The drain of the transistor P11 is connected to the output node Nd2, and the source of the transistor P11 is connected to the power-source potential Vcc terminal through the current source I2.

The internal chip enable signal $\overline{CEi}$ from the chip enable buffer 21' is applied to the gates of the transistors N11 and P11. The external address signal ADDR is applied to the gates of the transistors P12 and N12. The current value of the current source I2 is set to be smaller than that of the current flowing from the power-source potential Vcc terminal to the output node Nd2 through the source-drain path of transistor P12. Accordingly, a current flowing from the power-source potential Vcc terminal to the output node Nd2 through the source-drain path of transistor P11 is smaller than the current flowing through the source-drain path of transistor P12.

The operation of the address buffer 11' and the chip enable buffer 21' will be described When a chip enable signal $\overline{CE}$ of a logic "0" is supplied to the input terminal T1, the chip enable buffer 21' produces an internal chip enable signal $\overline{CEi}$ of a logic "1". The internal chip enable signal $\overline{CEi}$ of a logic "1" is supplied to the first input terminal of 2-input NAND gate 30 in the address buffer 11', viz., the gates of the transistors P11 and N11. As a result, the transistor N11 is turned on, the transistor P11 is turned off, and the NAND gate 30 is in an active state and responds to the address signal ADDR.

Let us consider a situation where, when the memory chip is in an active state, the address signal ADDR is changed from a logic "0" to a logic "1". In this case, the logic level at the input node Nd1 of the address buffer 11' changes from a logic "0" to a logic "1" after a preset delay of time which is caused by the C-R delay circuit TC. As a result, the logic level at the output node Nd2 of the NAND gate 30 changes from a logic "1" to a logic "0". Then, a logic level at the output of the CMOS inverter 13' is changed from a logic "0" to a logic "1". Also, a logic level at the output of the CMOS inverter 14' is changed from a logic "1" to a logic "0".

The output signal of the CMOS inverter 14' is applied as an internal address signal ADDRi to an internal circuit (not shown). In the internal circuit (including an address decoder, memory cell array, sense amplifier, output buffer, etc.), data is read from a memory cell which is specified by the internal address signal ADDRi. When the data is output from the output buffer, the ground potential Vss varies in the negative direction. In this case, in the address buffer 11', the C-R delay circuit TC absorbs the variation of the power source potential. On the other hand, in the chip enable o buffer 21', it has no C-R delay circuit TC at its preceding stage. So, when the ground potential Vss varies in the negative direction, the potential difference between the input node of the CMOS inverter 22' and the ground potential Vss terminal becomes larger. Consequently, in such a case, the chip enable buffer 21' may mistakenly recognize the chip enable signal $\overline{CE}$ of a logic "0" as that of a logic "1". In this case, with a potential variation at the output node of the CMOS inverter 22', the potential at the output node of the CMOS inverter 24' also varies. In an extreme case, the logic level of the internal chip enable signal $\overline{CEi}$ may be inverted from a logic "1" to a logic "0".

If the internal chip enable signal $\overline{CEi}$ is changed from a logic "1" to a logic "0", the transistor P11 of the NAND gate 30 of the address buffer 11' is turned on. In this instance, if the current source I2 is not provided and the source of the transistor P11 is directly connected to the power-source potential Vcc terminal, the potential at the output node Nd2 of the NAND gate 30 is rapidly pulled up by the transistor P11, so that the logic level of the node Nd2 is changed from a logic "0" to a logic "1". The outputs of the CMOS inverters 13' and 14' are thereby also inverted, and an internal address signal ADDRi of an incorrect logic level is outputted.

In the 6th embodiment, a current flowing from the power-source potential Vcc terminal to the node Nd2 through the transistor P11 is limited to a small value by the current source I2. Accordingly if the internal chip enable signal $\overline{CEi}$ is inverted from a logic "1" to a logic "0" and the transistor P11 is turned on, the logic level of the potential at the output node Nd2 of the NAND gate 30 will not be inverted immediately after it is turned on. This fact implies that if, before the logic level at the output node Nd2 is inverted, the logic level of the internal chip enable signal $\overline{CEi}$ returns to a correct level and the transistor P11 is turned off, the address buffer 11' will not produce an internal address signal ADDRi of an incorrect logic level.

The time taken for the logic level at the output node Nd2 of the NAND gate 30 to be changed from a logic "0" to a logic "1" is determined by the current value of the current source I2 and the parasitic capacitance existing in the node Nd2 (the parasitic capacitance including wiring capacitance between the NAND gate 30 and the CMOS inverter 13', and the gate capacitance of the transistors P3' and N3' of the CMOS inverter 13').

In this case, if the parasitic capacitance of the node Nd2 is large, a potential variation at the output node Nd2 of the NAND gate 30 for the address signal ADDR is delayed by its parasitic capacitance. The delay of the potential variation would delay the data read speed. For this reason, it is not preferable to set the parasitic capacitance of the node Nd2 to large.

In the case where the current value of the current source I2 is set to be small as in the 6th embodiment, the time required for the operating state of the NAND gate 30 to change from an active state to a stand-by state is longer. The potential variation at the node Nd2 is not delayed when the address signal ADDR changes. Therefore, in the case where the current value of the current source I2 is set to be small, even if the logic level of the internal chip enable signal $\overline{CEi}$ is inverted due to the variation of the power source potential, the false operation of the address buffer 11' can be prevented. Further, the potential at the output node Nd2 of the NAND gate 30 may be varied in accordance with the variation of the address signal ADDR, at a relatively high speed.

Figure 13:
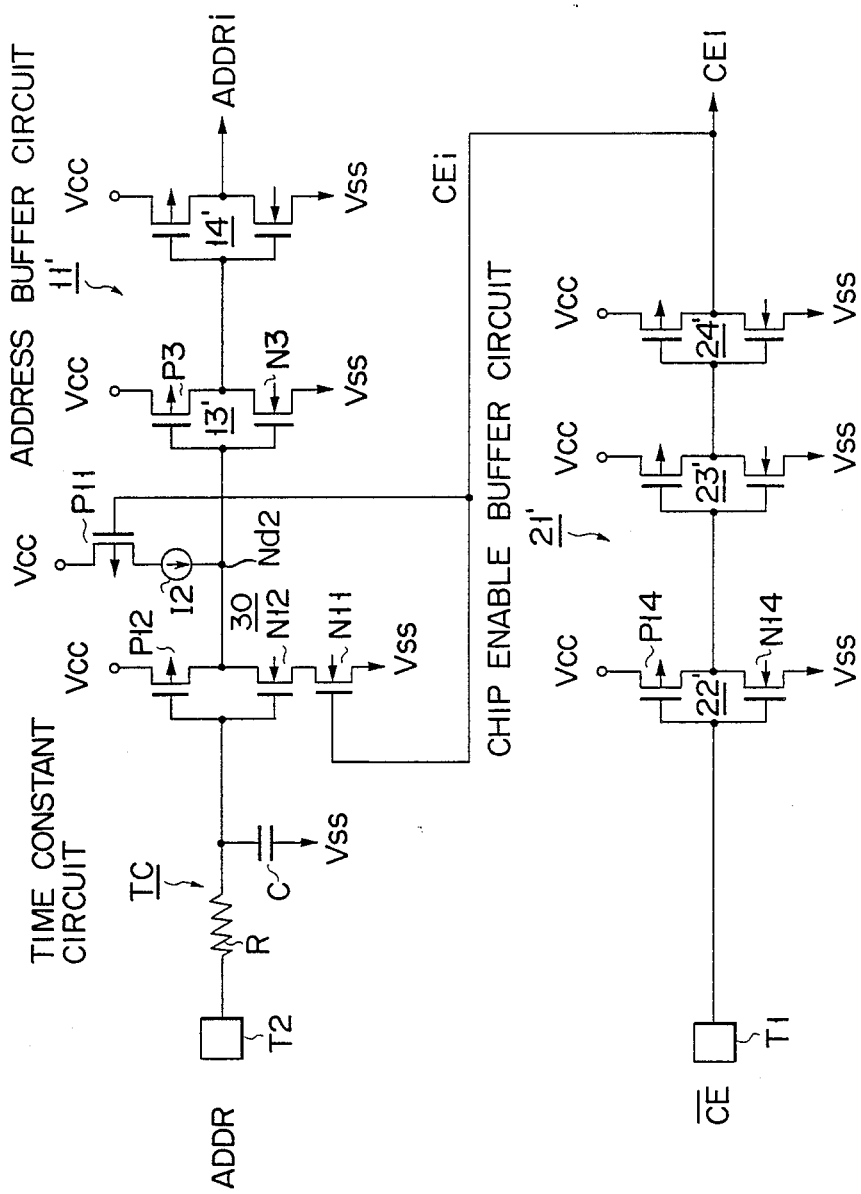
FIG. 13 shows a circuit arrangement containing input circuits provided in a semiconductor integrated circuit according to a 7th embodiment of the present invention.

Turning now to FIG. 13, there is shown the input circuits of a semiconductor integrated circuit according to a 7th embodiment of the present invention. The difference between the 7th embodiment and the 6th embodiment of FIG. 12 exists only in the arrangement of the NAND gate 30.

In the NAND gate 30 in the 7th embodiment, the current source I2 is connected between the output node Nd2 of the NAND gate 30 and the drain of the p-channel MOS transistor P11. The source of the transistor P11 is connected to the power-source potential Vcc terminal.

Figure 14:
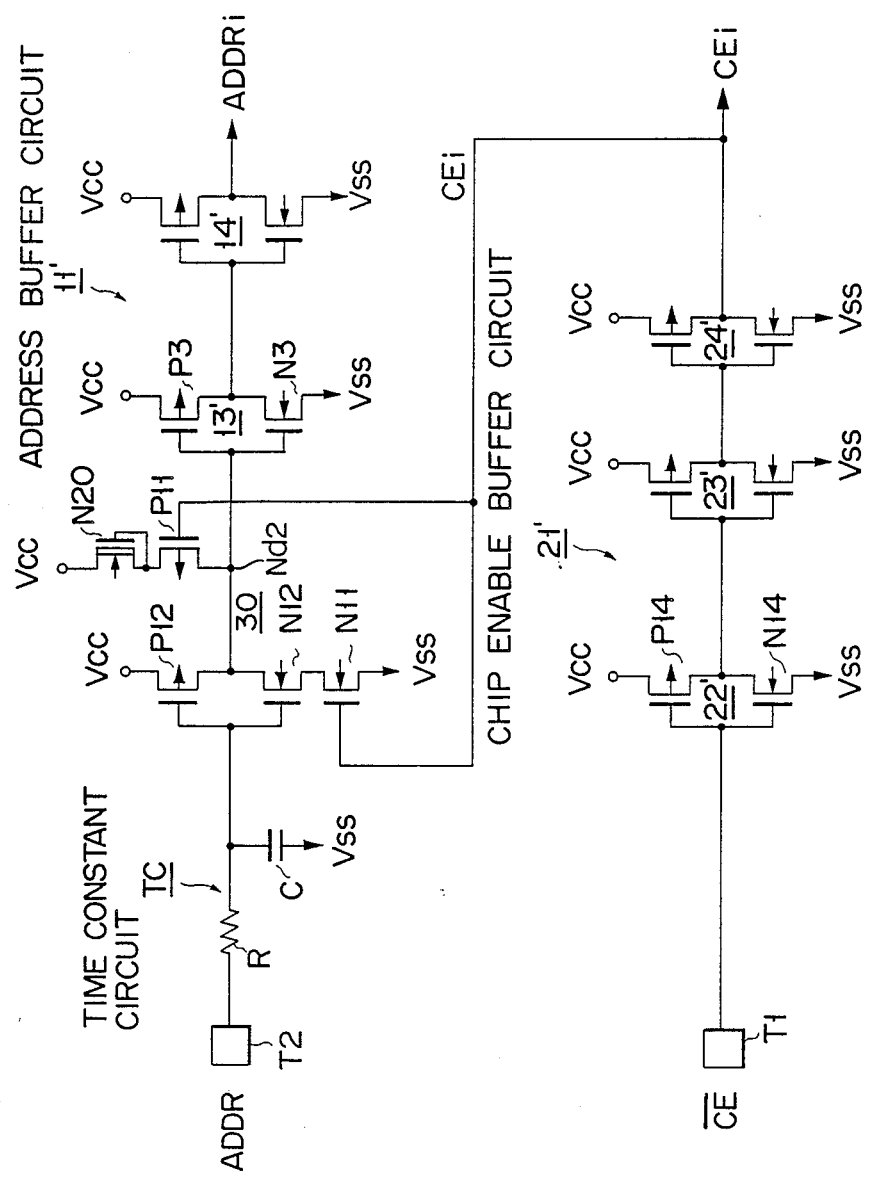
FIG. 14 shows a circuit arrangement containing input circuits provided in a semiconductor integrated circuit according to an 8th embodiment of the present invention.

FIG. 14 shows a circuit arrangement of the input circuits of a semiconductor integrated circuit according an 8th embodiment of the present invention. The 8th embodiment uses an n-channel depletion mode MOS transistor N20 in place of the current source I2 provided in the NAND gate 30 in the 6th embodiment of FIG. 12. The gate and source of the transistor N20 are connected to the source of the transistor P11. The drain of the transistor N20 is connected to the power-source potential Vcc terminal.

The MOS transistor N20 in this instance serves substantially as a constant current source.

The n-channel depletion mode MOS transistor N20 used in the present embodiment may be used in place of the current source I2 of the 7th embodiment shown in FIG. 13. In this case, the source and the gate of the transistor N20 are connected to the node Nd2, and its drain is connected to the drain of the transistor P11.

Figure 15:
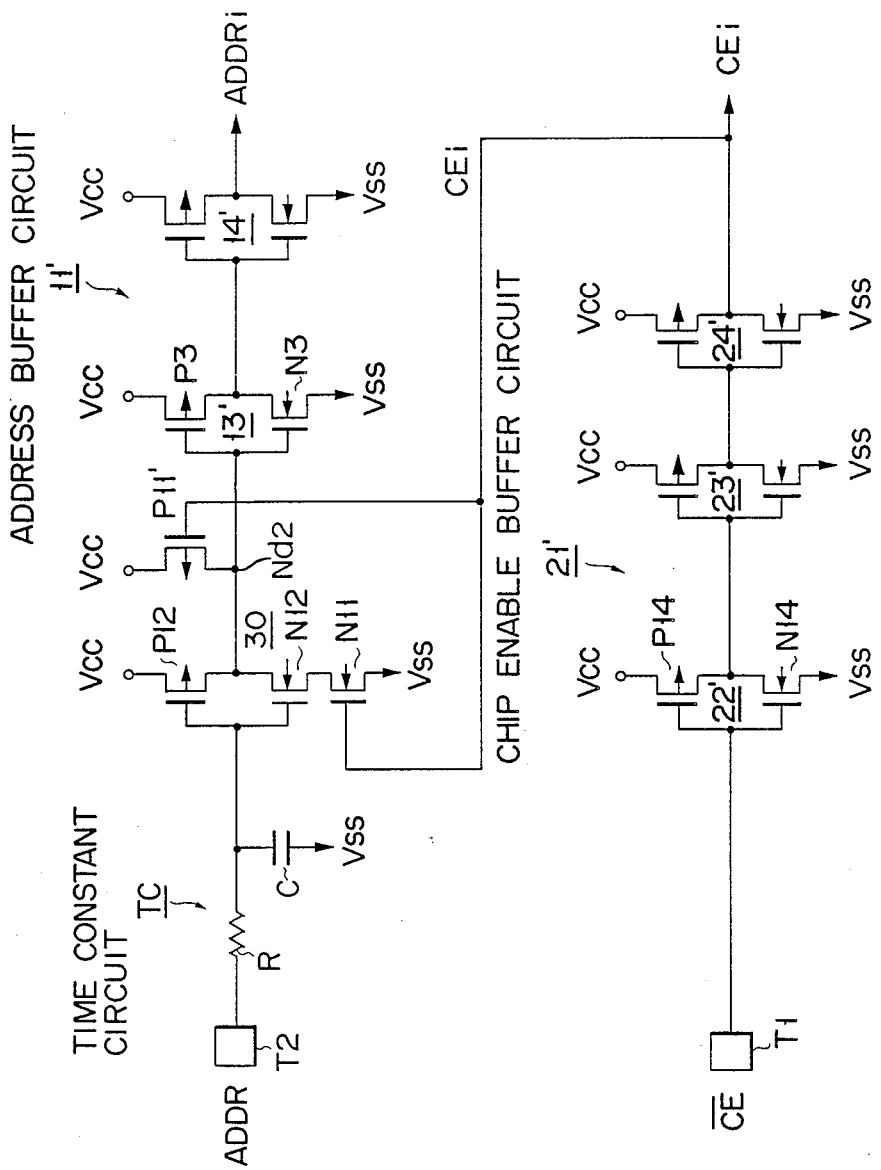
FIG. 15 shows a circuit arrangement containing input circuits provided in a semiconductor integrated circuit according to a 9th embodiment of the present invention.

FIG. 15 shows a circuit arrangement containing input circuits provided in a semiconductor integrated circuit according to a 9th embodiment of the present invention.

In the 9th embodiment, the current source I2 is not used in the NAND gate 30, and a p-channel enhancement mode MOS transistor P11' is used in place of the p-channel enhancement mode MOS transistor P11 in the 6th embodiment of FIG. 12.

The drain of the transistor P11' is connected to the node Nd2. The internal chip enable signal $\overline{CEi}$ from the chip enable buffer 21' is applied to the gate of the transistor P11'. The source of the transistor P11' is connected to the power-source potential Vcc terminal. The conductance of the transistor P11' is set to be smaller than that of the transistor P12 coupled in parallel with the transistor P11'. To be more specific, the conductance of the transistor P11' is selected so that the time taken for a logic level at the output node Nd2 of the NAND gate 30 to be changed from a logic "0" to a logic "1" is longer than the time in which the internal chip enable signal $\overline{CEi}$ is inverted by the variation of the power source potential variation, viz., the time that the transistor P11' is turned on.

Figure 16:
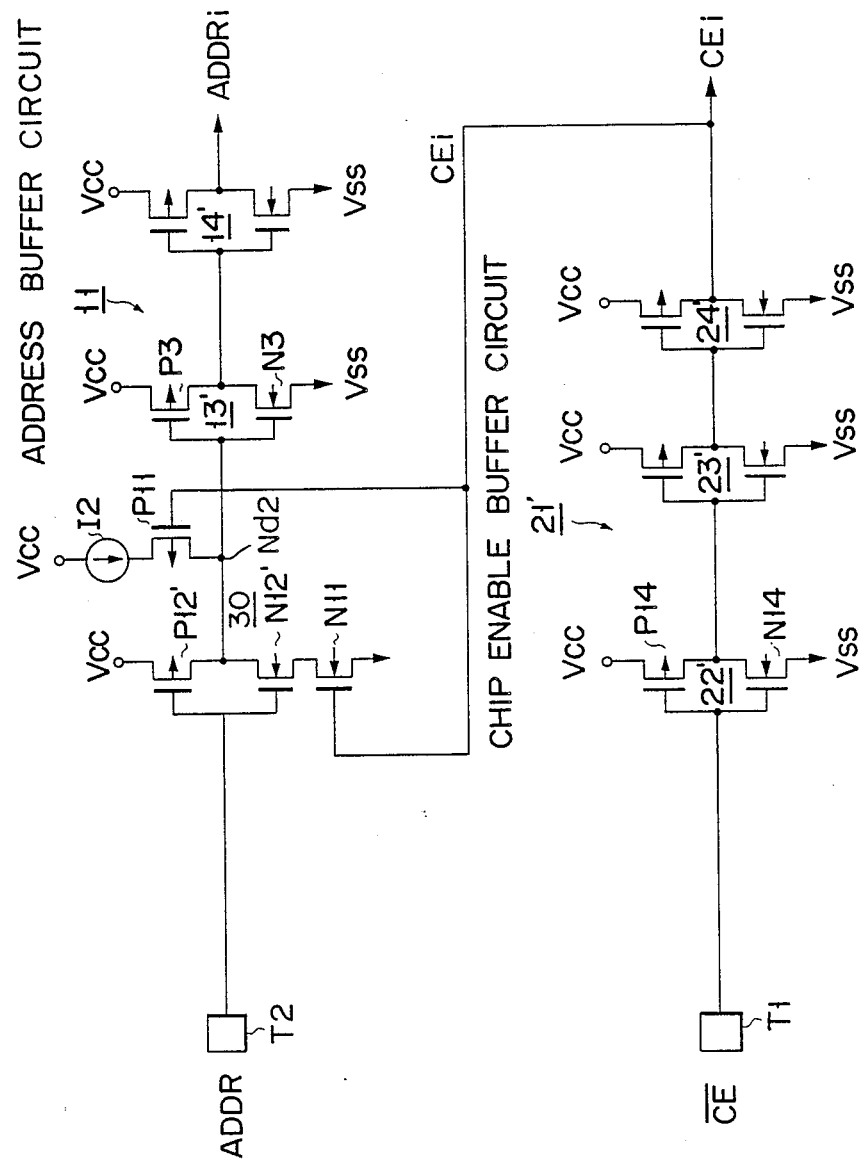
FIG. 16 shows a circuit arrangement containing input circuits provided in a semiconductor integrated circuit according to a 10th embodiment of the present invention.

FIG. 16 shows a circuit arrangement containing input circuits provided in a semiconductor integrated circuit according to a 10th embodiment of the present invention. The 10th embodiment is different from the 6th embodiment of FIG. 12 in the following points. The C-R delay circuit TC, which is located at the prestage of the address buffer circuit 11', is not used in this embodiment. Further, the transistors P12 and N12 in the NAND gate 30 are replaced by p- and n-channel enhancement mode MOS transistors P12' and N12' whose conductances are smaller than those of the transistors P12 and N12.

In the 10th embodiment without the CR time constant circuit TC at the prestage of the address buffer 11', when the ground potential Vss varies in the negative direction under a condition where an address signal ADDR of a logic "0" is applied to the input terminal T2, there is the possibility that the transistor N12' in the NAND gate 30 is mistakenly turned on. In this case, if the conductance of the transistor N12' is set to be larger as in the case of the ordinary memory device, the output node Nd2 of the NAND gate 30 mistakenly changes its logic state from a logic "1" to a logic "0" immediately after the transistor N12' is turned on. It is noted that in the 10th embodiment the conductance of the transistor N12' is set to be small, and the logic state at the node Nd2 will not be inverted immediately after the transistor N12' is turned on due to the variation of the power source potential. Accordingly the false operation of the address buffer 11' due to the variation of the power source potential can be prevented if the conductance of the transistor N12' is selected to be such a value that the time required for the logic level at the node Nd2 of the NAND gate 30 to be inverted from a logic "1" to a logic "0" by the transistor N12' is longer than the time that the transistor N12' is turned on by the variation of the power source potential.

Similarly, when the power-source potential Vcc swings in the positive direction under a condition that an address signal ADDR of a logic "1" is applied to the input terminal T2, there is the possibility that the transistor P12' in the NAND gate 30 is mistakenly turned on, and the logic level at the output node Nd2 is mistakenly changed from a logic "0" to a logic "1". Also this false operation of the address buffer 11' can be prevented if the conductance of the transistor P12' is selected to be such a value that the time required for the logic level at the node Nd2 of the NAND gate 30 to be inverted from a logic "0" to a logic "1" by the transistor P12' is longer than the time in which the transistor P12' is turned on due to the variation of the power source potential.

While the present invention has been described using CMOS integrated circuits, the input circuits, i.e., the address buffer circuit and the chip enable buffer circuit according to the present invention, may also be realized in NMOS integrated circuits.

The NOR and NAND gates in the address buffer circuits are of the 2-input type, but may also be of the 3-input type.

What is claimed is:

1. A semiconductor integrated circuit comprising:
   a first input circuit for generating an internal chip enable signal for controlling said semiconductor integrated circuit to be in an active state or a stand-by state, in response to a chip enable signal externally applied; and
   a second input circuit for applying a signal to an internal circuit, said signal is corresponding to a data signal externally applied, said second input circuit including a gate circuit responsive to said internal chip enable signal and said data signal,
   said gate circuit responding to said data signal at a first response speed, and responding to said internal chip enable signal at a second response speed when said semiconductor integrated circuit is changed from said active state to said stand-by state, said second response speed being slower than said first response speed so as to prevent said semiconductor integrated circuit from being set into the stand-by state by a false operation of said first input circuit.

2. The integrated circuit according to claim 1, in which said gate circuit includes first switching means controlled by said data signal and second switching means controlled by said internal chip enable signal, said first and second switching means having first and second current paths connected in parallel with each other between an output node of said gate circuit and a predetermined potential supply terminal, the value of a current flowing through said second current path of said second switching means being smaller than the value of a current flowing through said first current path of said first switching means.

3. The integrated circuit according to claim 2, in which said value of said current flowing through said second current path of said second switching means is selected such that the time taken for a logic state at said output node to be inverted by the current flowing through said second current path is longer than 5 nS.

4. The integrated circuit according to claim 2, in which said first switching means includes a first transistor controlled by said data signal, and said second switch means includes a second transistor controlled by said internal chip enable signal and a current source connected in series with said second transistor.

5. The integrated circuit according to claim 4, in which said current source includes a depletion mode transistor.

6. The integrated circuit according to claim 2, in which said first switching means includes a first transistor controlled by said data signal, said second switching means includes a second transistor controlled by said internal chip enable signal, and the conductance of said second transistor is smaller than that of said first transistor.

7. The integrated circuit according to claim 1, further comprising a delay circuit provided at the prestage of said second input circuit.

8. The integrated circuit according to claim 7, in which said delay circuit includes a capacitor and a resistor, a first end of said capacitor being coupled to a ground potential supply terminal and a second end of said capacitor being coupled to an input node of said second input circuit.

9. The integrated circuit according to claim 1, in which said gate circuit is a NOR gate having first and second input terminals, said first input terminal receiving said data signal and said second input terminal receiving said internal chip enable signal.

10. The integrated circuit according to claim 1, in which said gate circuit is a NAND gate having first and second input terminals, said first input terminal receiving said data signal and said second input terminal receiving said internal chip enable signal.

11. A semiconductor integrated circuit comprising:
a first input circuit for generating an internal chip enable signal for controlling said semiconductor integrated circuit to be in an active state or a standby state, in response to a chip enable signal externally applied;
a second input circuit for applying a signal to an internal circuit, said signal is corresponding to a data signal externally applied, said second input circuit containing a NOR gate responsive to said internal chip enable signal and said data signal, said NOR gate circuit including;
a first transistor of a first conductive type controlled by said data signal and being connected between an output terminal of said NOR gate and a ground potential supply terminal; and
a switching means controlled by said internal chip enable signal and being connected between said output terminal and said ground potential supply terminal, the value of a current flowing through said switching means being smaller than the value of a current flowing through said first transistor.

12. The integrated circuit according to claim 11, in which said switching means includes a second transistor of the first conductivity type controlled by said internal chip enable signal and a current source connected in series with said second transistor.

13. The integrated circuit according to claim 12, in which said first and second transistors have equal conductance, and the current value of said current source is smaller than the value of a current flowing from said output terminal to said ground potential supply terminal through said first transistor.

14. The integrated circuit according to claim 12, in which said current source includes a depletion mode transistor.

15. The integrated circuit according to claim 11 in which said switching means includes a second transistor of the first conductivity type controlled by said internal chip enable signal, the conductance of said second transistor being smaller than that of said first transistor.

16. The integrated circuit according to claim 11, in which said NOR gate further includes second and third transistors of a second conductivity type connected in series between a power source potential supply terminal and said output terminal, said second transistor is controlled by said data signal and said third transistor is controlled by said internal chip enable signal.

17. The integrated circuit according to claim 16, in which said first input circuit includes a CMOS inverter having a fourth transistor of the first conductivity type and a fifth transistor of the second conductivity type, the conductance of said first and second transistors of said NOR gate being smaller than that of said fourth and fifth transistors of said CMOS inverter.

18. The integrated circuit according to claim 16, further comprising a delay circuit provided at the prestage of said second input circuit, said first input circuit including a CMOS inverter having a fourth transistor of the first conductivity type and a fifth transistor of the second conductivity type, the conductance of said first and second transistors of said NOR gate being equal to that of said fourth and fifth transistors of said CMOS inverter.

19. A semiconductor integrated circuit comprising:
a first input circuit for generating an internal chip enable signal for controlling said semiconductor integrated circuit to be in an active state or a standby state in response to a chip enable signal externally applied;
a second input circuit for applying a signal to an internal circuit, said signal is corresponding to a data signal externally applied, said second input circuit containing a NAND gate; said NAND gate circuit including;
a first transistor of a first conductive type controlled by said data signal and being connected between an output terminal of said NAND gate and a power-source potential supply terminal; and
a switching means controlled by said internal chip enable signal and being connected between said output terminal and said power-source potential supply terminal, the value of a current flowing through said switching means being smaller than the value of a current flowing through said first transistor.

20. The integrated circuit according to claim 19, in which said switching means includes a second transistor of the first conductivity type controlled by said internal chip enable signal and a current source connected in series with said second transistor.

21. The integrated circuit according to claim 20, in which said first and second transistors have equal conductance, and said current source supplies a current smaller than a current flowing from said power-source potential terminal to said output terminal through said first transistor.

22. The integrated circuit according to claim 20, in which said current source includes a depletion mode transistor.

23. The integrated circuit according to claim 19, in which said switching means includes a second transistor of the first conductivity type controlled by said internal chip enable signal, the conductance of said second transistor being smaller than that of said first transistor.

24. The integrated circuit according to claim 19, in which said NAND gate further includes second and third transistors of a second conductivity type connected in series between a ground potential supply terminal and said output terminal, said second transistor being controlled by said data signal and said third transistor being controlled by said internal chip enable signal.

25. The integrated circuit according to claim 24, in which said first input circuit includes a CMOS inverter including a fourth transistor of the first conductivity type and a fifth transistor of the second conductivity type, the conductance of said first and second transistors of said NAND gate being smaller than that of said fourth and fifth transistors of said CMOS inverter.

26. The integrated circuit according to claim 24, further comprising a delay circuit provided at the prestage of said second input circuit, said first input circuit including a CMOS inverter which includes a fourth transistor of the first conductivity type and a fifth transistor of the second conductivity type, the conductance of said first and second transistors of said NAND gate being equal to that of said fourth and fifth transistors of said CMOS inverter.

* * * * *

REEXAMINATION CERTIFICATE (1825th)

United States Patent [19]
Kikuchi et al.

[11] B1 4,983,861
[45] Certificate Issued  Oct. 27, 1992

[54] SEMICONDUCTOR INTEGRATED CIRCUIT WITH AN INPUT BUFFER CIRCUIT FOR PREVENTING FALSE OPERATION CAUSED BY POWER NOISE

[75] Inventors: Shinichi Kikuchi; Hiroshi Iwahashi, both of Yokohama; Hideo Kato; Isao Sato, both of Kawasaki, all of Japan

[73] Assignee: Kabushiki Kaisha Toshiba, Japan

Reexamination Request:
No. 90/002,578, Feb. 12, 1992

Reexamination Certificate for:
Patent No.: 4,983,861
Issued: Jan. 8, 1991
Appl. No.: 412,120
Filed: Sep. 25, 1989

[30] Foreign Application Priority Data

Sep. 25, 1988 [JP] Japan ............................. 63-240023

[51] Int. Cl.$^5$ ................ H03K 19/003; H03K 19/094; H03K 17/16; H03K 17/284
[52] U.S. Cl. ................................. 307/443; 307/449; 307/468; 307/594; 307/451; 365/206; 365/226

[58] Field of Search ............... 307/473, 475, 448, 451, 307/452, 453, 468, 469, 470, 481, 263, 268; 365/230.06, 206, 228, 226

[56] References Cited

U.S. PATENT DOCUMENTS

| | | | |
|---|---|---|---|
| 4,661,928 | 4/1987 | Yasuoka | 307/443 |
| 4,777,389 | 10/1988 | Wu et al. | 307/448 |
| 4,800,298 | 1/1989 | Yu et al. | 307/443 |
| 4,820,942 | 4/1989 | Chan | 307/443 |
| 4,918,332 | 4/1990 | Nix | 307/443 |

*Primary Examiner*—John Zazworsky

[57] ABSTRACT

A semiconductor integrated circuit comprises a first input circuit for generating an internal chip enable signal in response to a chip enable signal externally applied; and a second input circuit for supplying to an internal circuit a signal corresponding to a data signal externally applied thereto, the second input circuit containing a gate circuit controlled by an internal chip enable signal. The gate circuit responds to the data signal at a first response speed, and responds to the internal chip enable signal at a second response speed when the semiconductor integrated circuit is changed from the active state to the stand-by state. The second response speed being slower than the first response speed, so as to prevent the semi-conductor integrated circuit from being set into the stand-by state by a false operation of the first input circuit.

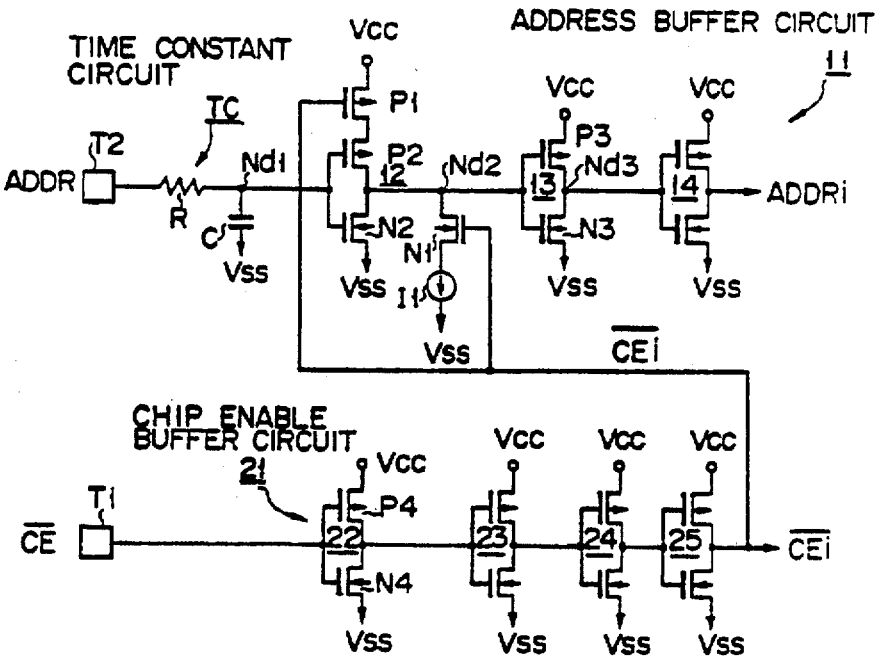

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 17, 18, 25 and 26 are cancelled.

Claims 1-16 and 19-24 are determined to be patentable as amended.

1. [A] *An* input buffer circuit *for a* semiconductor integrated circuit *having an active state and a standby state, the input buffer circuit receiving an external data signal and being responsive to an external chip enable signal, the input buffer circuit,* comprising:
 a first input circuit for generating an internal chip enable signal for controlling said semiconductor integrated circuit to be in [an] *the* active state or [a] *the* standby state, in response to [a] *the external* chip enable signal [externally applied]; and
 a second input circuit for applying [a signal to an internal circuit, said signal is corresponding to a] *the external* data signal [externally applied] *to said semiconductor integrated circuit*, said second input circuit including a gate circuit responsive to said internal chip enable signal and said data signal,
 said gate circuit responding to said data signal at a first response speed, and responding to said internal chip enable signal at a second response speed when said semiconductor integrated circuit is changed from said active state to said stand-by state, said second response speed being slower than said first response speed [so as] to prevent said semiconductor integrated circuit from being set into the stand-by state by a false operation of said first input circuit.

2. The [integrated] *input buffer* circuit according to claim 1, [in which ] *wherein* said gate circuit [includes] *further comprises* first switching means controlled by said data signal and second switching means controlled by said internal chip enable signal, said first and second switching means having first and second current paths, *respectively,* connected in parallel with each other between an output node of said gate circuit and a predetermined potential supply terminal, the value of a current flowing through said second current path of said second switching means being smaller than the value of a current flowing through said first current path of said first switching means *so that said second response speed is slower than said first response speed.*

3. The [integrated] *input buffer* circuit according to claim 2, [in which ] *wherein* said value of said current flowing through said second current path of said second switching means is selected such that [the] *a* time taken for a logic state at said second output node to be inverted by the current flowing through said current path is longer than 5 [nS] *nanoseconds.*

4. The [integrated] *input buffer* circuit according to claim 2, [in which ] *wherein* said first switching means includes a first transistor controlled by said data signal, and said second [switch] *switching* means includes a second transistor controlled by said internal chip enable signal and a current source connected in series with said second transistor.

5. The [integrated] *input buffer* circuit according to claim 4, [in which ] *wherein* said current source includes a depletion mode transistor.

6. The [integrated] *input buffer* circuit according to claim 2, [in which ] *wherein* said first switching means includes a first transistor controlled by said data signal, siad second switching means includes a second transistor controlled by said internal chip enable signal, and the conductance of said second transistor is smaller than [that] *the conductance* of said first transistor.

7. The [integrated] *input buffer* circuit according to claim 1, further comprising a delay circuit [provided at the prestage of] *for receiving the external data signal and for applying said external data signal to* said second input circuit.

8. The [integrated] *input buffer* circuit according to claim 7, [in which] *wherein* said delay circuit includes a capacitor and a resistor, a first end of said capacitor being coupled to a ground potential supply terminal and a second end of said capacitor being coupled to an input node of said second input circuit.

9. The [integrated] *input buffer* circuit according to claim 1, [in which] *wherein* said gate circuit is a NOR gate having first and second input terminals, said first input terminal receiving said data signal and said second input terminal receiving said internal chip enable signal.

10. The [integrated] *input buffer* circuit according to claim 1, [in which] *wherein* said gate circuit is a NAND gate having first and second input terminals, said first input terminal receiving said data signal and said second input terminal receiving said internal chip enable signal.

11. [A] *An* input buffer circuit *for a* semiconductor integrated circuit *having an active state and a standby state, the input buffer circuit receiving an external data signal and being responsive to an external chip enable signal, the input buffer circuit,* comprising:
 a first input circuit for generating an internal chip enable signal for controlling said semiconductor integrated circuit to be in [an] *the* active state or [a] *the* standby state, in response to [a] *the external* chip enable signal [externally applied]; *and*
 a second input circuit for applying [a signal to an internal circuit, said signal is corresponding to a] *the external* data signal *to said semiconductor integrated circuit* [externally applied], said second input circuit [containing] *comprising* a NOR gate *circuit* responsive to said internal chip enable signal and said data signal, said NOR gate circuit [including;] *comprising:*
 a first transistor of a first conductive type controlled by said data signal and being connected between an output terminal of said NOR gate *circuit* and a ground potential supply terminal; and
 a switching means controlled by said internal chip enable signal and being connected between said output terminal and said ground potential supply terminal, *said switching means being turned on when the integrated circuit is in the stand-by state,* the value of a current flowing through said switching means being smaller than the value of a current flowing through said first transistor.

12. The [integrated] *input buffer* circuit according to claim 11, [in which] *wherein* said switching means includes a second transistor of the first conductivity type controlled by said internal chip enable signal and a current source connected in series with said second transistor.

13. The [integrated] *input buffer* circuit according to claim 12, [in which said first and second transistors have equal conductance, and] *wherein* the current value of said current source is smaller than the value of a current flowing from said output terminal to said ground potential supply terminal through said first transistor *so that the value of the current flowing through said switching means is smaller than the value of the current flowing through said first transistor.*

14. The [integrated] *input buffer* circuit according to claim 12, [in which] *wherein* said current source includes a depletion mode transistor.

15. The [integrated] *input buffer* circuit according to claim 11, [in which] *wherein* said switching means includes a second transistor of the first conductivity type controlled by said internal chip enable signal, the conductance of said second transistor being smaller than [that] *the conductance* of said first transistor.

16. The [integrated] *input buffer* circuit according to claim 11, [in which] *wherein* said NOR gate *circuit* further includes second and third transistors of a second conductivity type connected in series between a power source potential supply terminal and said output terminal, said second transistor [is] *being* controlled by said data signal and said third transistor [is] *being* controlled by said internal chip enable signal.

19. [A] *An* input buffer circuit *for a* semiconductor integrated circuit *having an active state and a standby state, the input buffer circuit receiving an external data signal and being responsive to an external chip enable signal, the input buffer circuit,* comprising:

a first input circuit for generating an internal chip enable signal for controlling said semiconductor integrated circuit to be in [an] *the* active state or [a] *the* stand-by state in response to [a] *the external* chip enable signal [externally applied]; *and* a second input circuit for applying [a signal to an internal circuit, said signal is corresponding to a] *the external* data signal [externally applied] *to said semiconductor integrated circuit*, said second input circuit [containing] *comprising* a [NAND gate; said] NAND gate circuit [including;] *having an output terminal and comprising:* a first transistor of a first conductive type controlled by said data signal and being connected between [an] *said* output terminal of said NAND gate *circuit* and a power-source potential supply terminal; and a switching means controlled by said internal chip enable signal and being connected between said output terminal *of said NAND gate circuit* and said power-source potential supply terminal, *said switching means being turned on when the integrated circuit is in the stand-by state,* the value of a current flowing through said switching means being smaller than the value of a current flowing through said first transistor.

20. The [integrated] *input buffer* circuit according to claim 19, [in which] *wherein* said switching means includes a second transistor of the first conductivity type controlled by said internal chip enable signal and a current source connected in series with said second transistor.

21. The [integrated] *input buffer* circuit according to claim 20, [in which said first and second transistors have equal conductance, and] *wherein* said current source supplies a current smaller than a current flowing from said power-source potential terminal to said output terminal *of said NAND gate circuit* through said first transistor *so that the value of the current flowing through said switching means is smaller than the value of the current flowing through said first transistor.*

22. The [integrated] *input buffer* circuit according to claim 20, [in which] *wherein* said current source includes a depletion mode transistor.

23. The [integrated] *input buffer* circuit according to claim 19, [in which] *wherein* said switching means includes a second transistor of the first conductivity type controlled by said internal chip enable signal, the conductance of said second transistor being smaller than [that] *the conductance* of said first transistor.

24. The [integrated] *input buffer* circuit according to claim 19, [in which] *wherein* said NAND gate *circuit* further includes second and third transistors of a second conductivity type connected in series between a ground potential supply terminal and said output terminal, *of said NAND gate circuit,* said second transistor being controlled by said data signal and said third transistor being controlled by said internal chip enable signal.

* * * * *